United States Patent
Ou et al.

(10) Patent No.: US 12,287,988 B2
(45) Date of Patent: Apr. 29, 2025

(54) DATA STORAGE DEVICE AND NON-VOLATILE MEMORY CONTROL METHOD

(71) Applicant: Silicon Motion, Inc., Jhubei (TW)

(72) Inventors: Hsu-Ping Ou, Zhubei (TW); Chien-Hung Lee, Tainan (TW)

(73) Assignee: SILICON MOTION, INC., Jhubei (TW)

(*) Notice: Subject to any disclaimer, the term of this patent is extended or adjusted under 35 U.S.C. 154(b) by 40 days.

(21) Appl. No.: 18/364,542

(22) Filed: Aug. 3, 2023

(65) Prior Publication Data
US 2024/0053929 A1    Feb. 15, 2024

(30) Foreign Application Priority Data
Aug. 15, 2022   (TW) .................................. 111130525

(51) Int. Cl.
| | | |
|---|---|---|
| *G06F 3/06* | (2006.01) | |
| *G06F 12/02* | (2006.01) | |
| *G11C 7/10* | (2006.01) | |
| *G11C 16/08* | (2006.01) | |

(52) U.S. Cl.
CPC .......... *G06F 3/0659* (2013.01); *G06F 3/0604* (2013.01); *G06F 3/0679* (2013.01); *G06F 12/0246* (2013.01); *G11C 7/1063* (2013.01); *G11C 16/08* (2013.01)

(58) Field of Classification Search
CPC .... G06F 3/0659; G06F 3/0604; G06F 3/0679; G06F 3/0658; G06F 3/064; G06F 3/0644; G06F 12/0246; G11C 7/1063; G11C 16/08
See application file for complete search history.

(56) References Cited

U.S. PATENT DOCUMENTS

| | | | |
|---|---|---|---|
| 8,880,781 B2 | 11/2014 | Hong | |
| 10,705,986 B2 | 7/2020 | Wang et al. | |
| 2016/0378359 A1* | 12/2016 | Jang | G06F 12/0246 |
| | | | 711/118 |
| 2019/0294374 A1* | 9/2019 | Choi | G11C 11/4091 |
| 2020/0183826 A1* | 6/2020 | Beaudoin | G11C 29/42 |
| 2020/0192759 A1 | 6/2020 | Hwang et al. | |
| 2020/0218468 A1 | 7/2020 | Hsu | |
| 2021/0065755 A1 | 3/2021 | Kim et al. | |
| 2022/0334775 A1* | 10/2022 | Stotski | G06F 3/0644 |

FOREIGN PATENT DOCUMENTS

| | | |
|---|---|---|
| CN | 108228493 A | 6/2018 |
| TW | 201225087 A | 6/2012 |

* cited by examiner

*Primary Examiner* — Masud K Khan
(74) *Attorney, Agent, or Firm* — McClure, Qualey & Rodack, LLP

(57) ABSTRACT

A technique for accurate communication between a non-volatile memory and its controller. The controller accesses a storage area of the non-volatile memory through data lines, wherein the controller transmits a command through the data lines to access the storage area of the non-volatile memory. The command is further returned from the non-volatile memory to the controller through the data lines for comparison, to determine whether the command is correctly received by the non-volatile memory.

20 Claims, 4 Drawing Sheets

DATA STORAGE DEVICE AND NON-VOLATILE MEMORY CONTROL METHOD

CROSS REFERENCE TO RELATED APPLICATIONS

This application claims priority of Taiwan Patent Application No. 111130525, filed on Aug. 15, 2022, the entirety of which is incorporated by reference herein.

BACKGROUND OF THE INVENTION

Field of the Invention

The present invention relates to the control technology of the data storage device.

Description of the Related Art

There are various forms of non-volatile memory (NVM) for long-term data storage, such as flash memory, magnetoresistive random access memory (magnetoresistive RAM), ferroelectric RAM, resistive RAM, spin transfer torque-RAM (STT-RAM), and so on. These types of non-volatile memory may be used as the storage medium in a data storage device.

Non-volatile memory usually has its special storage characteristics and requires a corresponding storage architecture. In this technical field, a control technology must be developed based on the storage architecture of non-volatile memory.

BRIEF SUMMARY OF THE INVENTION

A control technology for a data storage device realized by non-volatile memory is shown.

A data storage device in accordance with an exemplary embodiment of the present invention has a non-volatile memory and a controller. The controller is coupled to the non-volatile memory and is configured to control the non-volatile memory as requested by a host. The controller accesses a storage area of the non-volatile memory through data lines, wherein the controller transmits a command through the data lines to access the storage area of the non-volatile memory. Especially, the command is further returned from the non-volatile memory to the controller through the data lines for comparison, to determine whether the command is correctly received by the non-volatile memory.

In an exemplary embodiment, in response to a write-enable signal, the non-volatile memory receives the command from the data lines as indicated by a command latch-enable signal. In response to a read-enable signal, the controller receives the returned command from the data lines as indicated by the command latch-enable signal.

In an exemplary embodiment, when the returned command is different from the command that the controller originally transmitted to the non-volatile memory, the controller resends the command to the non-volatile memory.

The controller further transmits an address through the data lines to access the storage area of the non-volatile memory. In an exemplary embodiment, the address is further returned from the non-volatile memory to the controller through the data lines for comparison, to determine whether the address is correctly received by the non-volatile memory.

In an exemplary embodiment, in response to the write-enable signal, the non-volatile memory receives the address from the data lines as indicated by an address latch-enable signal. In response to the read-enable signal, the controller receives the returned address from the data lines as indicated by the address latch-enable signal.

In an exemplary embodiment, when the returned address is different from the address that the controller originally transmitted to the non-volatile memory, the controller resends the address to the non-volatile memory.

In an exemplary embodiment, the storage area is activated by a chip-enable signal. In response to enablement of the chip enable signal, the non-volatile memory performs a recording process based on the write-enable signal, to record the command that is received from the data lines as indicated by the command latch-enable signal, and to record the address that is received from the data lines as indicated by the address latch-enable signal. Prior to the chip-enable signal being disabled, the non-volatile memory ends the recording process and controls the read-enable signal to perform a return process, to return the recorded command to the controller through the data lines as indicated by the command latch-enable signal, and to return the recorded address to the controller through the data lines as indicated by the address latch-enable signal.

In an exemplary embodiment, a non-volatile memory control method based on the forgoing concepts is shown.

In the non-volatile memory, the recording process and the return process may be performed in a first-in first-out (FIFO) manner.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
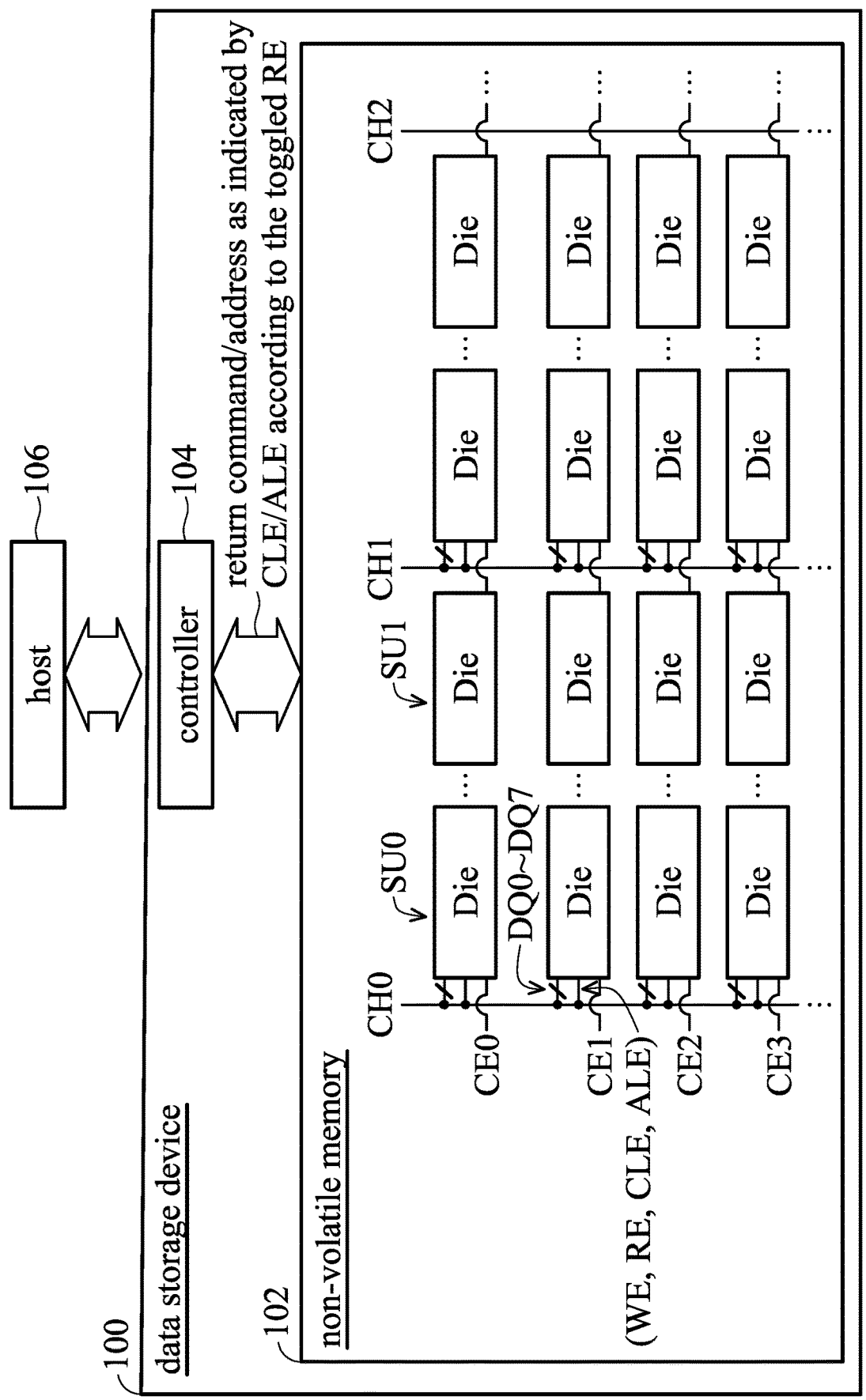
FIG. 1 illustrates a data storage device 100 in accordance with an exemplary embodiment of the present invention.

The following description is made for the purpose of illustrating the general principles of the invention and should not be taken in a limiting sense. The scope of the invention is best determined by reference to the appended claims.

A non-volatile memory for long-term data retention may be a flash memory, a magnetoresistive random access memory (magnetoresistive RAM), a ferroelectric RAM, a resistive RAM, a spin transfer torque-RAM (STT-RAM) and so on. The following discussion uses flash memory as an example.

Today's data storage devices often use flash memory as the storage medium for storing user data from the host. There are many types of data storage devices, including memory cards, universal serial bus (USB) flash devices, solid-state drives (SSDs), and so on. In another exemplary embodiment, a flash memory may be packaged with a controller to form a multiple-chip package called eMMC (embedded multimedia card).

A data storage device using a flash memory as a storage medium can be applied in a variety of electronic devices, including a smartphone, a wearable device, a tablet computer, a virtual reality device, etc. A calculation module of an electronic device may be regarded as a host that operates the data storage device equipped on the electronic device to access the flash memory within the data storage device.

A data center may be built with data storage devices using flash memories as the storage medium. For example, a server may operate an array of SSDs to form a data center. The server may be regarded as a host that operates the SSDs to access the flash memories within the SSDs.

Flash memory has its special storage characteristics. A host may issue logical addresses (for example, logical block addresses LBAs or global host page numbers GHPs) to read or write the flash memory. Logical addresses need to be mapped to physical addresses of the physical space of the flash memory. The mapping rule depends on the architecture of a flash memory.

The physical space of a flash memory is divided into a plurality of blocks for storage. A flash memory should be erased in units of blocks. The data in the same block should be erased together, and the storage space of a flash memory is released block by block. In an example, each block BLK includes a plurality of pages (e.g., page 0 to page 255), each page includes a plurality of sectors (e.g., 32 sectors per page), and each sector may store 512B user data. Thus, each page may provide a data area of 16 KB, and may have a 2B spare area attached at the end. The spare area may be allocated to store mapping data, and the other information as meta data.

In some exemplary embodiments, a multi-channel technology is applied to improve the data throughput, by which a flash memory is accessed through multiple channels. A flash memory may has a plurality of dies (memory chips). The dies may be divided into groups to be accessed through the different channels. In the same group, the dies sharing the same channel may be activated in an interleaved way. For example, the dies in the same group may be alternately activated by a plurality of chip-enable signals (CE #, where #numbers the chip-enable signal). In an exemplary embodiment, the pages accessed at the same time through the different channels are treated as a super page, and the blocks owning the parallel accessed pages are treated as a super block. By the multi-channel technology, the storage space of a super block may be programmed in the order of the super page number (from low number to high number).

In an exemplary embodiment, the same chip-enable signal (CE #, where #numbers the chip-enable signal) enables at least one die of each channel, and each die is connected to a plurality of data lines (DQ #, where #numbers the data lines from 0 to 7).

As the process technology advances, a non-volatile memory may have the more dies. For example, a non-volatile memory may include 8 dies, 16 dies, 32 dies, or even more dies. Data lines DQ0~DQ7 for accessing such a large number of dies are complicated in wiring, and the transmission of data needs to be aligned with the data control signals WE/RE/CLE/ALE. In particular, the faster and faster access technology (e.g., GHz), results in the more sensitive signal transmission. The commands or addresses transmitted from the controller may not be correctly received by the non-volatile memory. The read/write data may be wrong, and the system may crash.

A technology for correct communication between a controller and a non-volatile memory controlled by the controller is introduced in the present invention.

FIG. 1 illustrates a data storage device 100 in accordance with an exemplary embodiment of the present invention, which includes a non-volatile memory 102, and a controller 104 coupled to the non-volatile memory 102. The controller 104 operates the non-volatile memory 102 as requested by a host 106.

The non-volatile memory 102 uses a plurality of channels (CH0, CH1, CH2 . . . ) to manage a plurality of dies (memory chips). The dies accessed through the same channel are activated in an interleaved way according to a plurality of chip-enable signals (CE0, CE1, CE2, CE3 . . . ). In the same channel, each chip-enable signal may activate at least one die. In the figure, multiple dies (SU0, SU1 . . . ) of the same channel are driven by one chip-enable signal. Each die is connected to a plurality of data lines DQ0 to DQ7 and are read or write by the controller 104 through the data lines DQ0 to DQ7. To read/write each storage area, the data lines DQ0 to DQ7 are paired with a write-enable signal WE, a read-enable signal RE, a command latch-enable signal CLE, an address latch-enable signal ALE.

The write-enable signal WE is provided to show that the data lines DQ0~DQ7 are used for communication from the controller 104 to the non-volatile memory 102. The read-enable signal RE is provided to show that the data lines DQ0~DQ7 are used for communication from the non-volatile memory 102 to the controller 104. The command latch-enable signal CLE is used for receiving commands from the data lines DQ0~DQ7. The address latch-enable signal ALE is used for receiving addresses from the data lines DQ0~DQ7. In the conventional technology, when the read-enable signal RE is enabled, the command latch-enable signal CLE and the address latch-enable signal ALE are disabled. That is, the conventional technology does not read any command or address from non-volatile memory. The conventional technology can only read data from the non-volatile memory. In the present invention, the command latch-enable signal CLE or the address latch-enable signal ALE is allowed to be enabled when the read-enable signal RE is enabled. In an exemplary embodiment, the non-volatile memory 102 returns the controller 104 the command or address previously received from the controller 104. The controller 104 compares the returned command/address with the originally transmitted command/address to determine whether the non-volatile memory 102 correctly receives the command/address originally transmitted from the controller 104.

Figure 2:
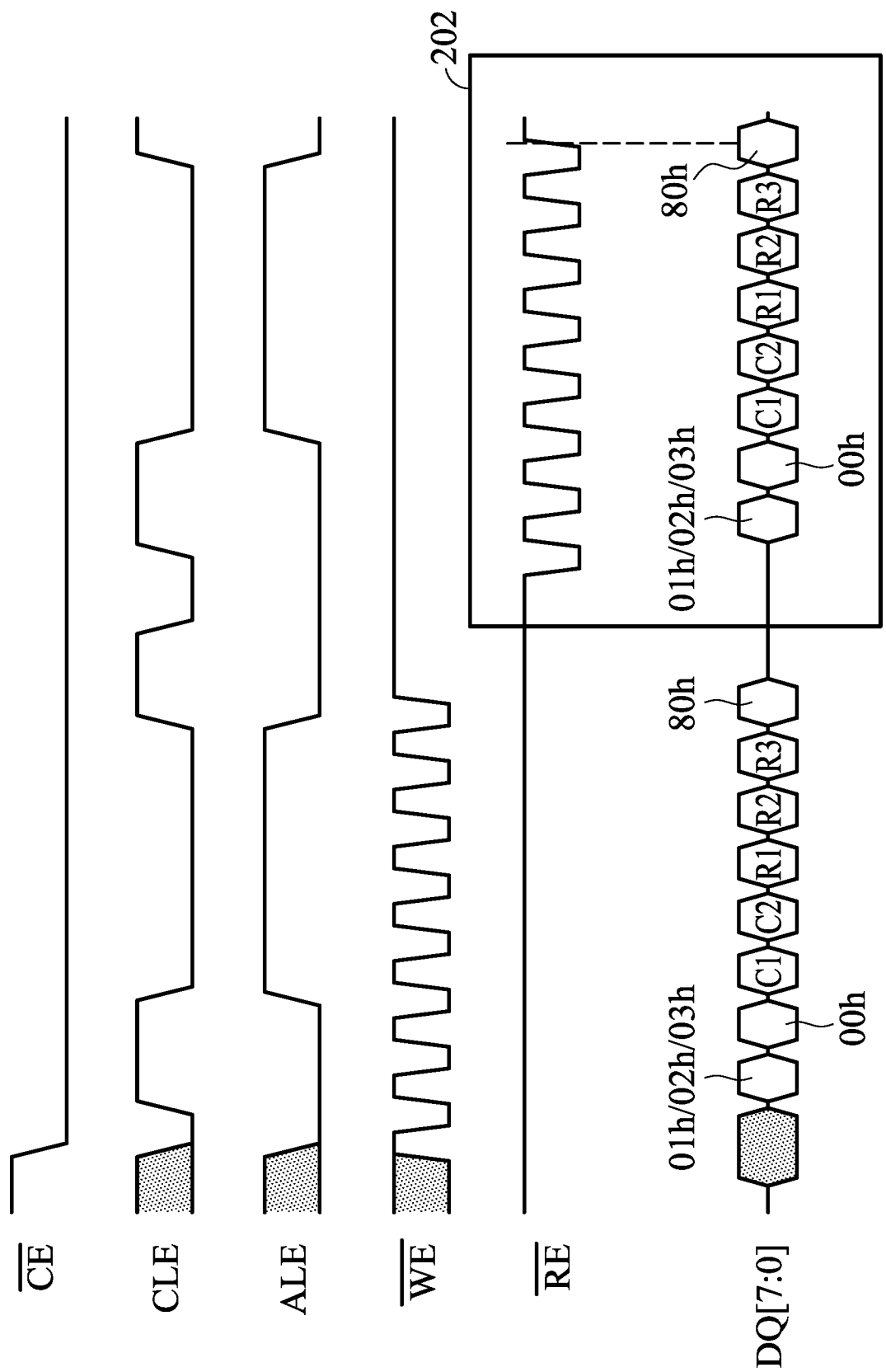
FIG. 2 is a waveform diagram illustrating waveforms related to a chip-enable signal CE (operative to activate a storage area), a command latch-enable signal CLE, an address latch-enable signal ALE, a write-enable signal WE, a read-enable signal RE, and signals on the data lines DQ[7:0] in accordance with an exemplary embodiment of the present invention.

FIG. 2 is a waveform diagram illustrating waveforms related to a chip-enable signal CE (operative to activate a storage area), a command latch-enable signal CLE, an address latch-enable signal ALE, a write-enable signal WE, a read-enable signal RE, and signals on the data lines DQ[7:0] in accordance with an exemplary embodiment of the present invention.

When a chip-enable signal CE is enabled (its inverted signal $\overline{CE}$ is switched to a low level), its corresponding storage area is activated. The non-volatile memory 102 performs a recording process based on the write-enable signal WE, to record the commands received from the data lines DQ[7:0] as indicated by the command latch-enable signal CLE, and record the addresses received from the data lines DQ[7:0] as indicated by the address latch-enable signal ALE. As shown in the figure, when the inverted signal $\overline{WE}$ of the write-enable signal WE is toggled between high and low, the non-volatile memory 102 performs a recording process. As indicated by the command latch-enable signal CLE, commands 01h/02h/03h are first received and recorded, then the command 00h is received and recorded, and then the command 80h is received and recorded. As indicated by the address latch-enable signal ALE, addresses C1, C2, R1, R2, and R3 received from the data lines DQ[7:0] are recorded. In an exemplary embodiment, the recorded commands/addresses may be temporarily stored in the registers or latches at the non-volatile memory 102 side.

Before the chip-enable signal CE is disabled ($\overline{CE}$ is switched back to high), the non-volatile memory 102 ends the recording process, and controls the read-enable signal RE to start a return process, to return the recorded commands/addresses back to the controller 104 through the data lines DQ[7:0]. The commands/addresses returned through the data lines DQ[7:0] are indicated by the command latch-enable signal CLE or the address latch-enable signal ALE. Referring to the box 202 in the figure, it shows the return process. In the box 202, the inverted signal $\overline{RE}$ of the read-enable signal RE is toggled between high and low, and the non-volatile memory 102 performs a return process. As indicated by the command latch-enable signal CLE, the first batch of recorded commands 01h/02h/03h are returned to the controller 104, and then the command 00h is returned to the controller 104, and then the last command 80h is returned to the controller 104. As indicated by the address latch-enable signal ALE, the previously recorded addresses C1, C2, R1, R2, and R3 are returned to controller 104. The controller 104 checks and confirms that the returned commands and addresses are in full compliance with the originally issued commands and addresses. It means that the data storage device 100 operates normally. On the contrary, if there is any non-compliance, the controller 104 resends the non-compliance command or address.

The recording process and the return process proposed in the present invention are particularly suitable for the multi-plane or multi-page access architecture of flash memory. The recording process may record multiple commands or addresses in a series. The return process may return the recorded commands or addresses in a series in a first-in first-out (FIFO) manner.

The recording process and the returning process in the present invention may be only used in the recording and returning of a single command.

Figure 3:
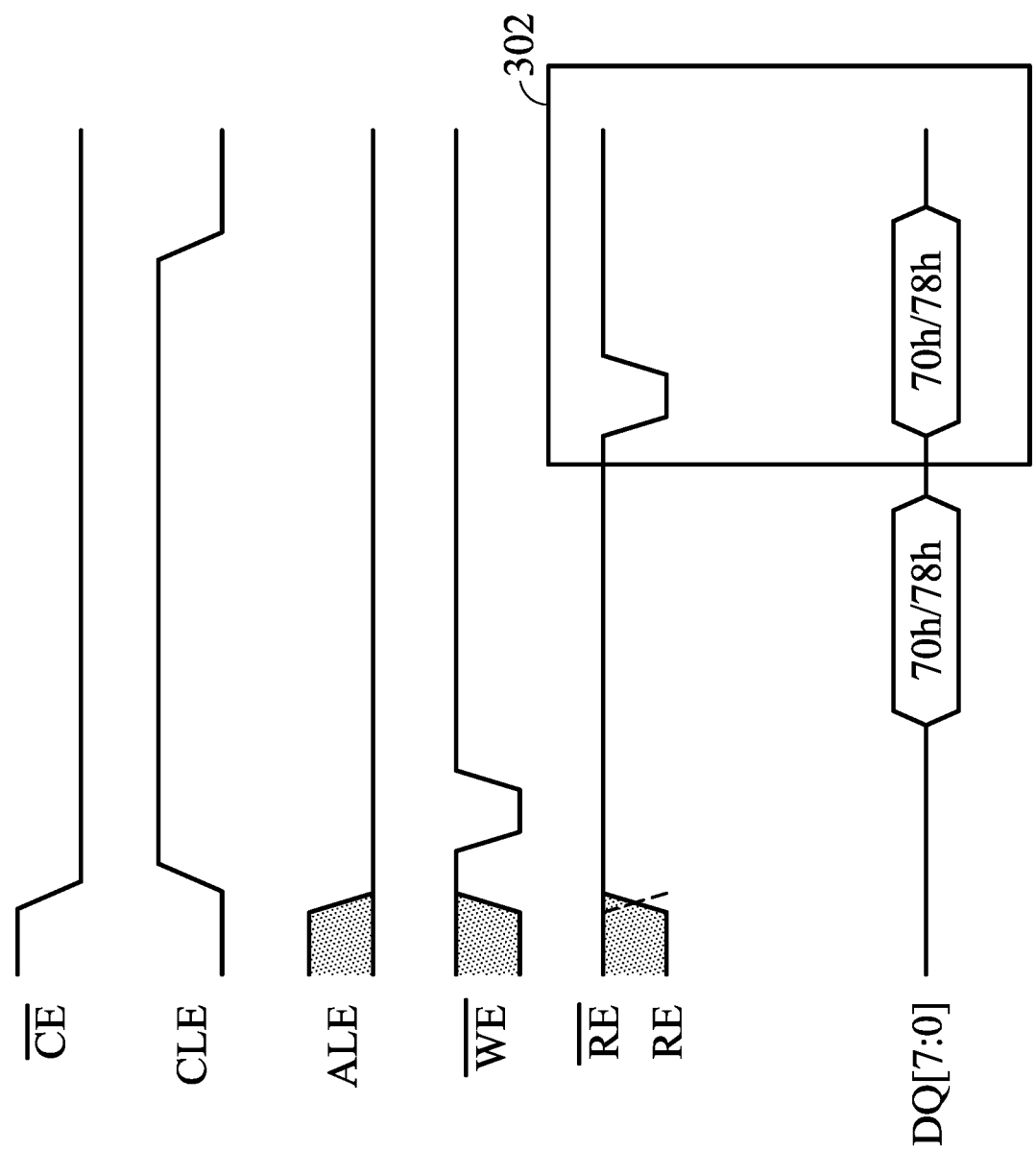
FIG. 3 is a waveform diagram illustrating waveforms related to a chip-enable signal CE (operative to activate a storage area), a command latch-enable signal CLE, an address latch-enable signal ALE, a write-enable signal WE, a read-enable signal RE, and data lines DQ[7:0] in accordance with an exemplary embodiment of the present invention.

For example, when the data storage device 100 is powered up, the controller 104 sends a status checking command to the non-volatile memory 102. The non-volatile memory 102 will return the received status checking command to the controller 104 for comparison. According to the comparison result, it is determined whether the status checking command received by the non-volatile memory 102 is exactly the status checking command originally issued by the controller 104. In this example, only one command is recorded and returned. FIG. 3 is a waveform diagram illustrating waveforms related to a chip-enable signal CE (operative to activate a storage area), a command latch-enable signal CLE, an address latch-enable signal ALE, a write-enable signal WE, a read-enable signal RE, and data lines DQ[7:0] in accordance with an exemplary embodiment of the present invention.

When the chip-enable signal CE is enabled ($\overline{CE}$ is switched to low), its corresponding storage area is activated. A recording process is performed at the non-volatile memory 102 side according to the write-enable signal WE (referring to the toggled $\overline{WE}$), to record a command 70h/78h that is received from the data lines DQ[7:0] as indicated by the command latch-enable signal CLE.

Before the chip-enable signal CE is disabled ($\overline{CE}$ is switched back to a high level), the non-volatile memory 102 ends the recording process, and controls the read-enable signal RE (to toggle $\overline{RE}$) to start a return process. The non-volatile memory 102 returns the previously recorded command 70h/78h to the controller 104. The box 302 in the figure shows the return process. The controller 104 checks and confirms that the returned command completely conforms to the originally issued command. The data storage device 100 is normally powered on. On the contrary, if the returned command does not match the originally issued command, the controller 104 resends the command. This design can replace the conventional ready announcement made by the non-volatile memory 102.

Figure 4:
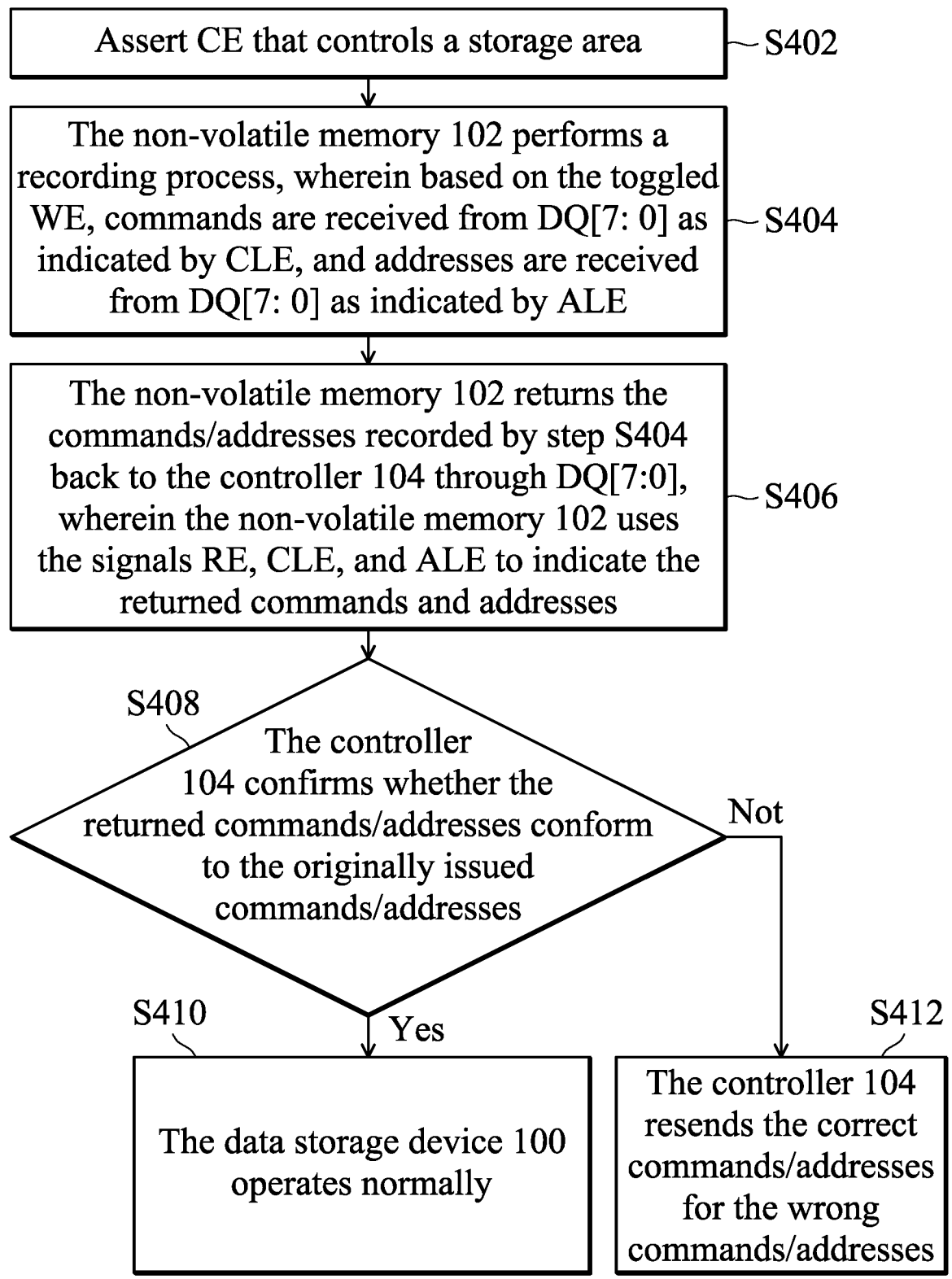
FIG. 4 is a flowchart illustrating operations of the data storage device 100 in accordance with an exemplary embodiment of the present application.

FIG. 4 is a flowchart illustrating operations of the data storage device 100 in accordance with an exemplary embodiment of the present application.

In step S402, a chip-enable signal CE controlling a storage area of the non-volatile memory 102 is asserted ($\overline{CE}$ is switched to a low level).

In step S404, the non-volatile memory 102 performs a recording process. Based on the toggled write-enable signal WE, commands are received from the data lines DQ[7:0] as indicated by the command latch-enable signal CLE, and addresses are received from the data lines DQ[7:0] as indicated by the address latch-enable signal ALE. The received commands and addresses are recorded at the non-volatile memory 102 side by the recording process.

In step S406, after the recording process made in step S404, the recorded commands/addresses are returned from the non-volatile memory 102 to the controller 104 through the data lines DQ[7:0], and the non-volatile memory 102 uses the read-enable signal RE, the command latch-enable signal CLE, and the address latch-enable signal ALE to indicate the returned commands/addresses.

In step S408, the controller 104 confirms whether the returned commands/addresses conform to the originally issued commands/addresses. If so, the procedure proceeds to step S410, and the data storage device 100 operates normally. If not, the procedure proceeds to step S412, and the controller 104 resends the correct commands/addresses for the wrong commands/addresses.

The above concepts can also be used to implement a non-volatile memory control method, including: operating the controller 104 to access a storage area of the non-volatile memory 102 through the data lines DQ[7:0], wherein the controller 104 transmits a command (or an address) through the data lines DQ[7:0] to access the storage area of the non-volatile memory 102; and returning the command (or an address) from the non-volatile memory 102 to the controller 104 through the data lines DQ[7:0] for comparison, to determine whether the command (or an address) is correctly received by the non-volatile memory 102.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A data storage device, comprising:
a non-volatile memory; and
a controller, coupled to the non-volatile memory and configured to control the non-volatile memory as requested by a host,
wherein:
the controller accesses a storage area of the non-volatile memory through data lines;
the controller transmits a command through the data lines to access the storage area of the non-volatile memory; and
the command is further returned from the non-volatile memory to the controller through the data lines for comparison between the returned command and the originally transmitted command, to determine whether the command is correctly received by the non-volatile memory based on comparison of command contents.

2. The data storage device as claimed in claim 1, wherein:
in response to a write-enable signal, the non-volatile memory receives the command from the data lines as indicated by a command latch-enable signal; and
in response to a read-enable signal, the controller receives the returned command from the data lines as indicated by the command latch-enable signal.

3. The data storage device as claimed in claim 2, wherein:
when the returned command is different from the command that the controller originally transmitted to the non-volatile memory, the controller resends the command to the non-volatile memory.

4. The data storage device as claimed in claim 3, wherein:
the storage area is activated by a chip-enable signal;
in response to enablement of the chip enable signal, the non-volatile memory performs a recording process based on the write-enable signal, to record contents that are received from the data lines as indicated by the command latch-enable signal; and
prior to the chip-enable signal being disabled, the non-volatile memory ends the recording process and controls the read-enable signal to perform a return process, to return the recorded contents to the controller through the data lines as indicated by the command latch-enable signal.

5. The data storage device as claimed in claim 4, wherein:
in the non-volatile memory, the recording process and the return process are performed in a first-in first-out manner.

6. The data storage device as claimed in claim 3, wherein:
the controller further transmits an address through the data lines to access the storage area of the non-volatile memory; and
the address is further returned from the non-volatile memory to the controller through the data lines for comparison, to determine whether the address is correctly received by the non-volatile memory.

7. The data storage device as claimed in claim 6, wherein:
in response to the write-enable signal, the non-volatile memory receives the address from the data lines as indicated by an address latch-enable signal; and
in response to the read-enable signal, the controller receives a comparison address returned from the data lines as indicated by the address latch-enable signal.

8. The data storage device as claimed in claim 7, wherein:
when the comparison address is different from the address that the controller originally transmitted to the non-volatile memory, the controller resends the address to the non-volatile memory.

9. The data storage device as claimed in claim 8, wherein:
the storage area is activated by a chip-enable signal;
in response to enablement of the chip enable signal, the non-volatile memory performs a recording process based on the write-enable signal, to record contents that are received from the data lines as indicated by the address latch-enable signal and the command latch-enable signal; and
prior to the chip-enable signal being disabled, the non-volatile memory ends the recording process and controls the read-enable signal to perform a return process, to return the recorded contents to the controller through the data lines as indicated by the address latch-enable signal and the command latch-enable signal.

10. The data storage device as claimed in claim 9, wherein:
in the non-volatile memory, the recording process and the return process are performed in a first-in first-out manner.

11. A non-volatile memory control method, comprising:
operating a controller to access a storage area of a non-volatile memory through data lines, wherein the controller transmits a command through the data lines to access the storage area of the non-volatile memory; and
returning the command from the non-volatile memory to the controller through the data lines for comparison between the returned command and the originally transmitted command, to determine whether the command is correctly received by the non-volatile memory based on comparison of command contents.

12. The non-volatile memory control method as claimed in claim 11, wherein:
in response to a write-enable signal, the non-volatile memory receives the command from the data lines as indicated by a command latch-enable signal; and
in response to a read-enable signal, the controller receives the returned command from the data lines as indicated by the command latch-enable signal.

13. The non-volatile memory control method as claimed in claim 12, wherein:
when the returned command is different from the command that the controller originally transmitted to the non-volatile memory, the controller resends the command to the non-volatile memory.

14. The non-volatile memory control method as claimed in claim 13, wherein:
the storage area is activated by a chip-enable signal;
in response to enablement of the chip enable signal, the non-volatile memory performs a recording process based on the write-enable signal, to record contents that are received from the data lines as indicated by the command latch-enable signal; and
prior to the chip-enable signal being disabled, the non-volatile memory ends the recording process and controls the read-enable signal to perform a return process, to return the recorded contents to the controller through the data lines as indicated by the command latch-enable signal.

15. The non-volatile memory control method as claimed in claim 14, wherein:
in the non-volatile memory, the recording process and the return process are performed in a first-in, first-out manner.

16. The non-volatile memory control method as claimed in claim 13, wherein:
the controller further transmits an address through the data lines to access the storage area of the non-volatile memory; and
the address is further returned from the non-volatile memory to the controller through the data lines for comparison, to determine whether the address is correctly received by the non-volatile memory.

17. The non-volatile memory control method as claimed in claim 16, wherein:
in response to the write-enable signal, the non-volatile memory receives the address from the data lines as indicated by an address latch-enable signal; and
in response to the read-enable signal, the controller receives a comparison address returned from the data lines as indicated by the address latch-enable signal.

18. The non-volatile memory control method as claimed in claim 17, wherein:
when the comparison address is different from the address that the controller originally transmitted to the non-volatile memory, the controller resends the address to the non-volatile memory.

19. The non-volatile memory control method as claimed in claim 18, wherein:
the storage area is activated by a chip-enable signal;
in response to enablement of the chip enable signal, the non-volatile memory performs a recording process based on the write-enable signal, to record contents that are received from the data lines as indicated by the address latch-enable signal and the command latch-enable signal; and
prior to the chip-enable signal being disabled, the non-volatile memory ends the recording process and controls the read-enable signal to perform a return process, to return the recorded address to the controller through the data lines as indicated by the address latch-enable signal and the command latch-enable signal.

20. The non-volatile memory control method as claimed in claim 19, wherein:
in the non-volatile memory, the recording process and the return process are performed in a first-in first-out manner.

* * * * *